(12) United States Patent
Nishikawa et al.

(10) Patent No.: US 12,273,999 B2
(45) Date of Patent: Apr. 8, 2025

(54) SURFACE-MOUNT ELECTRONIC COMPONENT AND CIRCUIT BOARD HAVING THE SAME

(71) Applicant: TDK Corporation, Tokyo (JP)

(72) Inventors: Tomonaga Nishikawa, Tokyo (JP); Masaki Endo, Tokyo (JP); Masaki Yoneyama, Tokyo (JP); Osamu Nakada, Tokyo (JP); Hironori Sato, Tokyo (JP); Ryota Naito, Yamanashi (JP)

(73) Assignee: TDK Corporation, Tokyo (JP)

( * ) Notice: Subject to any disclaimer, the term of this patent is extended or adjusted under 35 U.S.C. 154(b) by 216 days.

(21) Appl. No.: 17/971,137

(22) Filed: Oct. 21, 2022

(65) Prior Publication Data

US 2023/0132354 A1  Apr. 27, 2023

(30) Foreign Application Priority Data

Oct. 22, 2021  (JP) ................. 2021-172992

(51) Int. Cl.
*H05K 1/11* (2006.01)
*H05K 1/18* (2006.01)

(52) U.S. Cl.
CPC ............... *H05K 1/11* (2013.01); *H05K 1/181* (2013.01)

(58) Field of Classification Search
CPC .... H01L 23/4824; H01G 11/26; H05K 1/181; H05K 1/11
See application file for complete search history.

(56) References Cited

U.S. PATENT DOCUMENTS

2016/0211074 A1* 7/2016 Gu ...................... H05K 1/0306

FOREIGN PATENT DOCUMENTS

JP  2018-032812 A  3/2018

* cited by examiner

*Primary Examiner* — Jeremy C Norris
(74) *Attorney, Agent, or Firm* — Rimon P.C.

(57) ABSTRACT

Disclosed herein is a surface-mount electronic component that includes a main body part having a mounting surface, a first terminal electrode provided on one end side of the mounting surface in a long side direction thereof, and a second terminal electrode provided on other end side of the mounting surface in the long side direction thereof. Each of the first and second terminal electrode includes a main area extending in a short side direction of the mounting surface and a protruding part provided at a center portion in the short side direction so as to protrude from the main area to an end portion of the mounting surface in the long side direction.

13 Claims, 5 Drawing Sheets

SURFACE-MOUNT ELECTRONIC COMPONENT AND CIRCUIT BOARD HAVING THE SAME

CROSS-REFERENCE TO RELATED APPLICATIONS

The disclosure of Japanese Patent Application No. 2021-172992 filed on Oct. 22, 2021 including the specification, drawings and abstract is incorporated herein by reference in its entirety.

BACKGROUND OF THE ART

Field of the Art

The present disclosure relates to a surface-mount electronic component and a circuit board having the same and, more particularly, to a surface-mount two-terminal electronic component and a circuit board having the same.

Description of Related Art

JP 2018-032812A discloses a two-terminal electronic component. The electronic component described in JP 2018-032812A is provided with terminal electrodes which are disposed respectively at both ends thereof in the longitudinal direction.

A downsized electronic component is sometimes deviated in its mounting position in the short side direction thereof due to, e.g., misalignment of a solder resist on a substrate mounting electronic components thereon. Such deviation in mounting position is particularly conspicuous for a downsized two-terminal electronic component.

SUMMARY

An object of the present disclosure is therefore to suppress, in a surface-mount two-terminal electronic component and a circuit board having the same, deviation in mounting position of the electronic component in the short side direction thereof.

A surface-mount electronic component according to the present disclosure includes: a main body part having a mounting surface; a first terminal electrode provided on one end side of the mounting surface in the long side direction thereof; and a second terminal electrode provided on the other end side of the mounting surface in the long side direction thereof. The first and second terminal electrodes each include a main area extending in the short side direction of the mounting surface and a protruding part provided at the center portion in the short side direction so as to protrude from the main area to the end portion of the mounting surface in the long side direction.

A circuit board according to the present disclosure incudes: a substrate having first and second land patterns; the above-described surface-mount electronic component mounted on the substrate; and a solder connecting the first and second land patterns to the first and second terminal electrodes, respectively. The first and second land patterns each include a main pattern overlapping the main area and a sub pattern overlapping the protruding part and smaller in width in the short side direction than the main pattern.

BRIEF DESCRIPTION OF THE DRAWINGS

The above features and advantages of the present disclosure will be more apparent from the following description of certain embodiments taken in conjunction with the accompanying drawings, in which.

DETAILED DESCRIPTION OF THE EMBODIMENTS

Some embodiments of the present disclosure will be explained below in detail with reference to the accompanying drawings.

Figure 1:
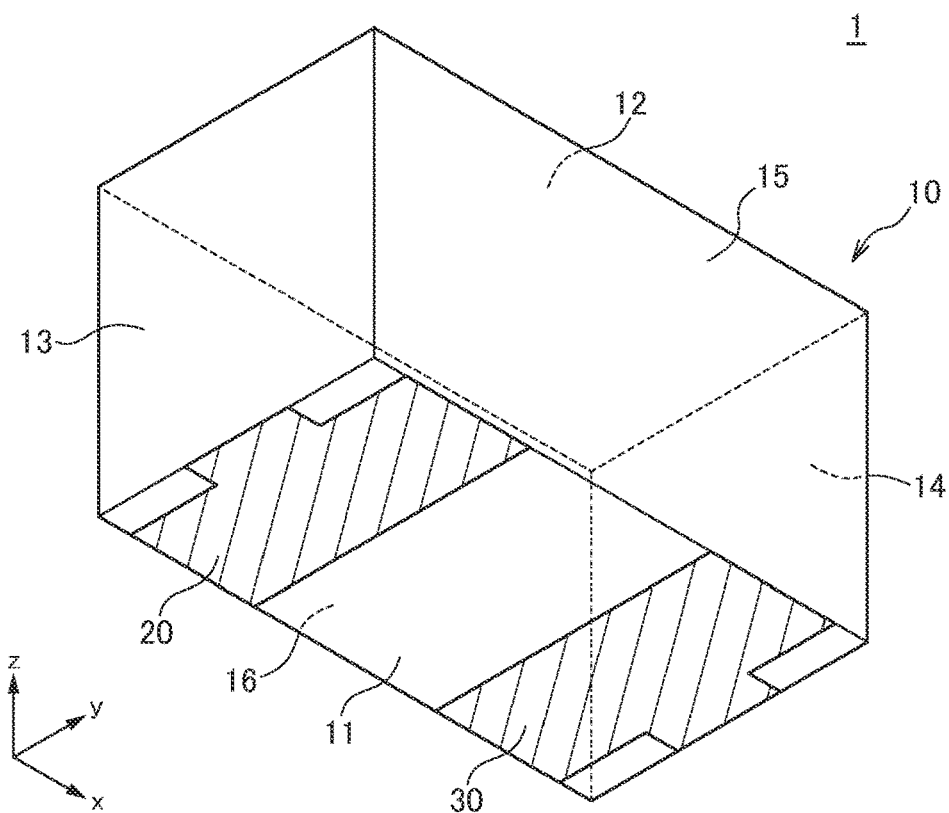
FIG. 1 is a schematic perspective view illustrating the outer appearance of a surface-mount electronic component 1 according to a first embodiment of the present disclosure.

FIG. 1 is a schematic perspective view illustrating the outer appearance of a surface-mount electronic component 1 according to a first embodiment of the present disclosure.

The surface-mount electronic component 1 illustrated in FIG. 1 is a two-terminal electronic component including a main body part 10 incorporating functional elements such as an inductor, a capacitor, and a resistor and terminal electrodes 20 and 30 provided on the surface of the main body part 10. The main body part 10 has a substantially rectangular parallelepiped shape having a mounting surface 11, an upper surface 12, side surfaces 13, 14, 15, and 16. The mounting surface 11 and upper surface 12 constitute the xy plane, the side surfaces 13 and 14 constitute the yz plane, and the side surfaces 15 and 16 constitute the xz plane. The terminal electrodes 20 and 30 are provided on the mounting surface 11.

Figure 2:
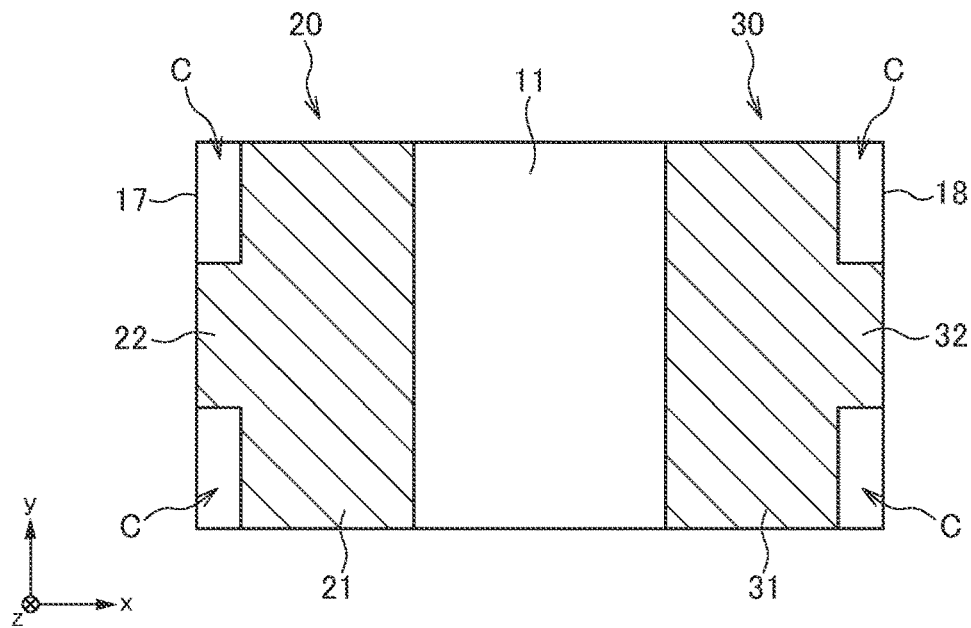
FIG. 2 is a schematic plan view illustrating the structure of the mounting surface 11.

FIG. 2 is a schematic plan view illustrating the structure of the mounting surface 11.

As illustrated in FIG. 2, the terminal electrode 20 is positioned at one end in the x-direction (longitudinal direction) of the mounting surface 11, and the terminal electrode 30 is on the other end in the x-direction of the mounting surface 11. The terminal electrode 20 includes a main area 21 extending in the y-direction (short side direction) and a protruding part 22 positioned in the center portion in the y-direction and protruding from the main area 21. Similarly, the terminal electrode 30 includes a main area 31 extending in the y-direction and a protruding part 32 positioned in the center portion in the y-direction and protruding from the main area 31. As described above, the terminal electrodes 20 and 30 each have a protrusion. In the present embodiment, the terminal electrodes 20 and 30 are provided only on the mounting surface 11. That is, the terminal electrodes 20 and 30 are not formed on the other surfaces such as side surfaces 13 and 14.

The main areas 21 and 31 are provided over the entire width in the y-direction of the mounting surface 11. That is, the width of each of the main areas 21 and 31 in the y-direction is the same as the width of the mounting surface 11 in the y-direction. On the other hand, the width of each of the protruding parts 22 and 32 in the y-direction is smaller than the width of the mounting surface 11 in the y-direction. The protruding part 22 extends from the main area 21 to one end portion 17 of the mounting surface 11 in the x-direction. Similarly, the protruding part 32 extends from the main area 31 to the other end portion 18 of the mounting surface 11 in the x-direction. The end portion 17 is an edge at which the mounting surface 11 and the side surface 13 meet each other, and the end portion 18 is an edge at which the mounting surface 11 and the side surface 14 meet each other.

With the above structure, clearance areas C where the terminal electrodes 20 and are not present are formed between the main areas 21, 31 and the end portions 17, 18, and the protruding parts 22 and 32 are each disposed so as to be sandwiched between two clearance areas C in the y-direction.

Figure 3:
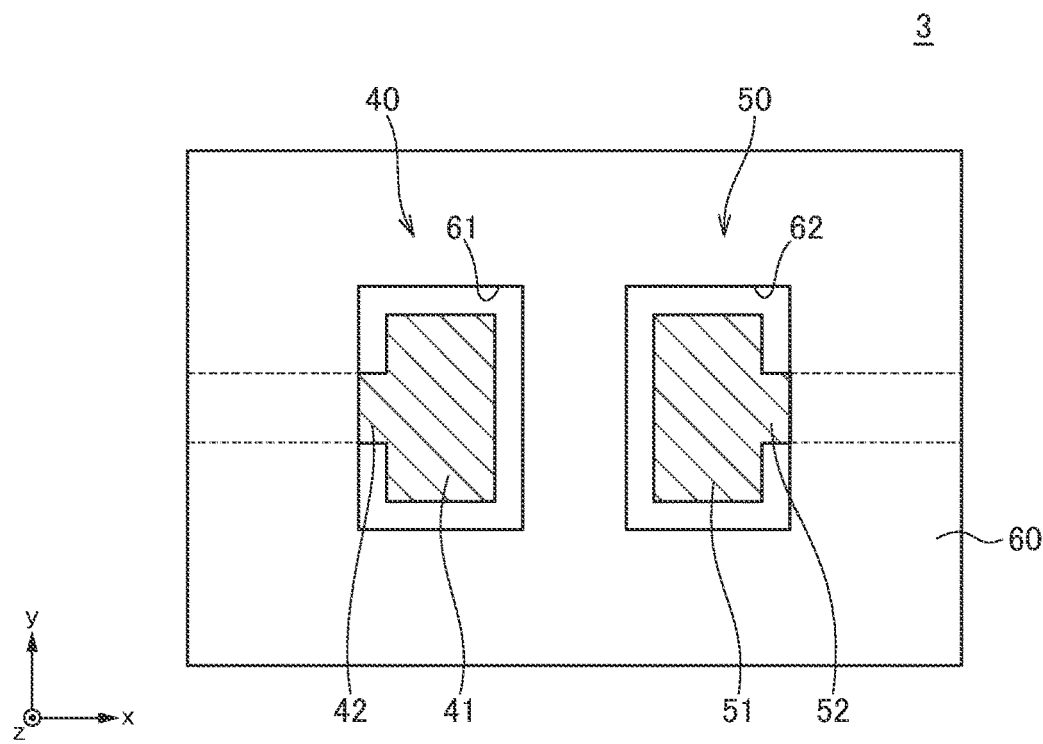
FIG. 3 is a schematic plan view illustrating the structure of a main part of a substrate 3 on which the surface-mount electronic component 1 is mounted.

FIG. 3 is a schematic plan view illustrating the structure of a main part of a substrate 3 on which the surface-mount electronic component 1 is mounted.

The substrate 3 on which the surface-mount electronic component 1 is mounted has land patterns 40, 50 and a solder resist 60. The solder resist 60 has openings 61 and 62 through which the land patterns 40 and 50 are exposed respectively. The exposed portion of the land pattern 40 has a main pattern 41 and a sub pattern 42. Similarly, the exposed portion of the land pattern 50 has a main pattern 51 and a sub pattern 52. The exposed portions of the land patterns 40 and 50 have shapes corresponding to the terminal electrodes 20 and 30 of the surface-mount electronic component 1. That is, the sub patterns 42 and 52 are smaller in width in the y-direction than the main patterns 41 and 51 and are connected to the y-direction center portions of the main patterns 41 and 51, respectively.

Figure 4:
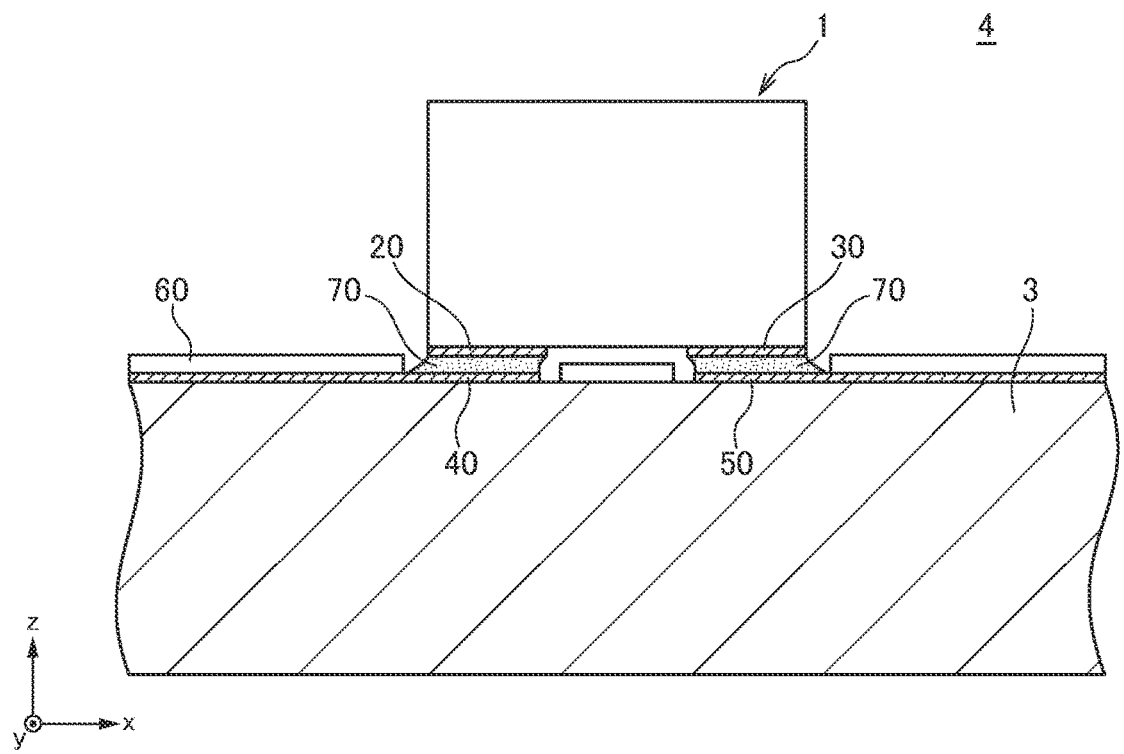
FIG. 4 is a front view of a circuit board 4 including the substrate 3 and the surface-mount electronic component 1 mounted on the substrate 3.
Figure 5:
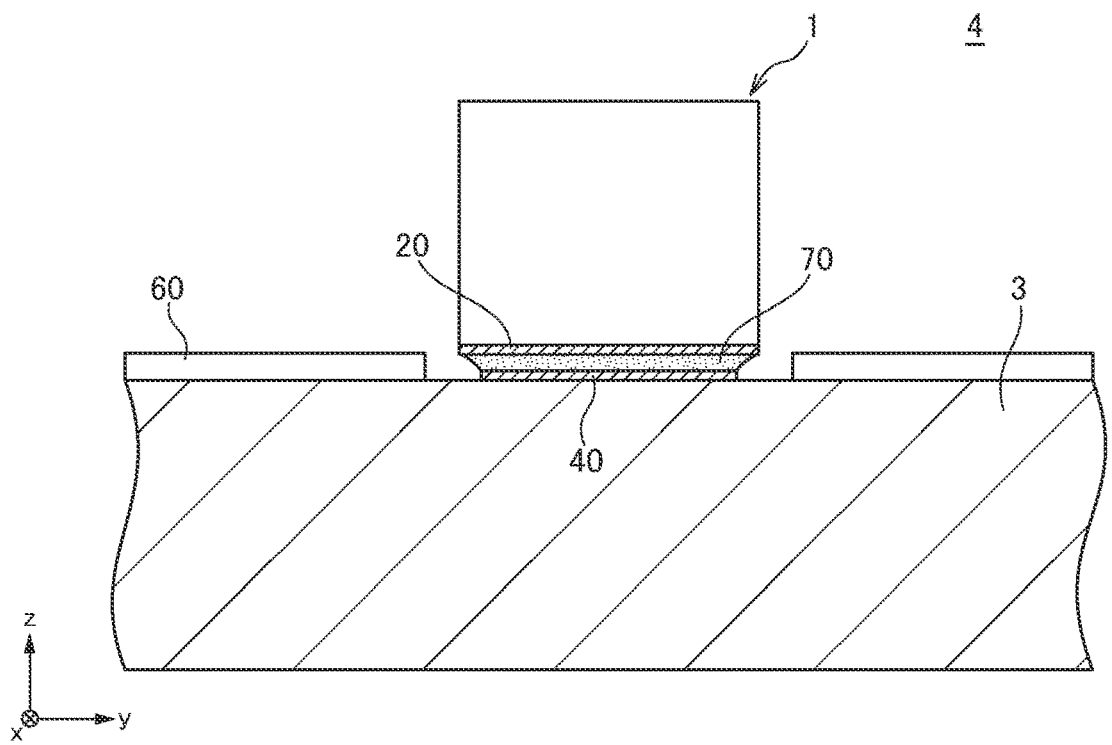
FIG. 5 is a side view of a circuit board 4 including the substrate 3 and the surface-mount electronic component 1 mounted on the substrate 3.

FIGS. 4 and 5 are front and side views of a circuit board 4 including the substrate 3 and the surface-mount electronic component 1 mounted on the substrate 3.

As illustrated in FIGS. 4 and 5, when the surface-mount electronic component 1 is mounted on the substrate 3, the terminal electrodes 20 and 30 are connected respectively to the land patterns 40 and 50 through solders 70. In the example illustrated in FIGS. 4 and 5, the land patterns 40 and 50 are slightly smaller in size than the terminal electrodes 20 and 30. That is, the main patterns 41 and 51 are slightly smaller in width in the x- and y-directions than the main areas 21 and 31. The sub patterns 42 and 52 are slightly smaller in width in the y-direction than the protruding parts 22 and 32. As a result, most of the solder 70 stays on the mounting surface 11, which is the bottom surface of the surface-mount electronic component 1, and this is advantageous in high-density mounting.

Figure 6:
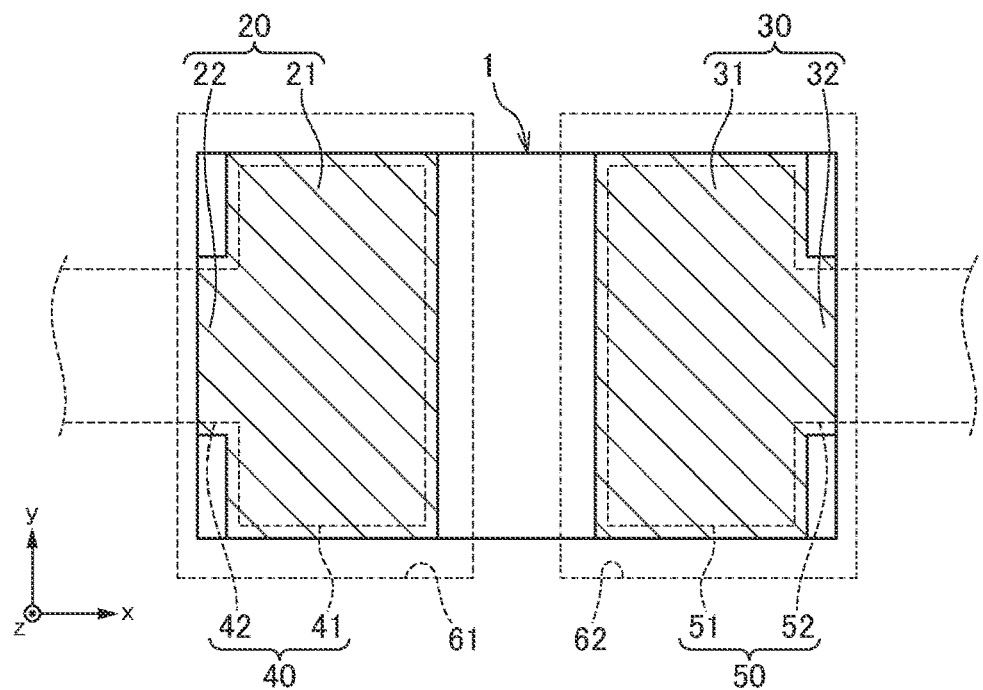
FIG. 6 is a schematic view for explaining overlap between the terminal electrodes 20, 30 and the land patterns 40, 50.

FIG. 6 is a schematic view for explaining overlap between the terminal electrodes 20, 30 and the land patterns 40, 50.

As illustrated in FIG. 6, when the surface-mount electronic component 1 is mounted on the substrate 3, the main area 21 and protruding part 22 of the terminal electrode 20 overlap the main pattern 41 and sub pattern 42 of the land pattern 40, respectively, and the main area 31 and protruding part 32 of the terminal electrode 30 overlap the main pattern 51 and sub pattern 52 of the land pattern 50, respectively.

Figure 7:
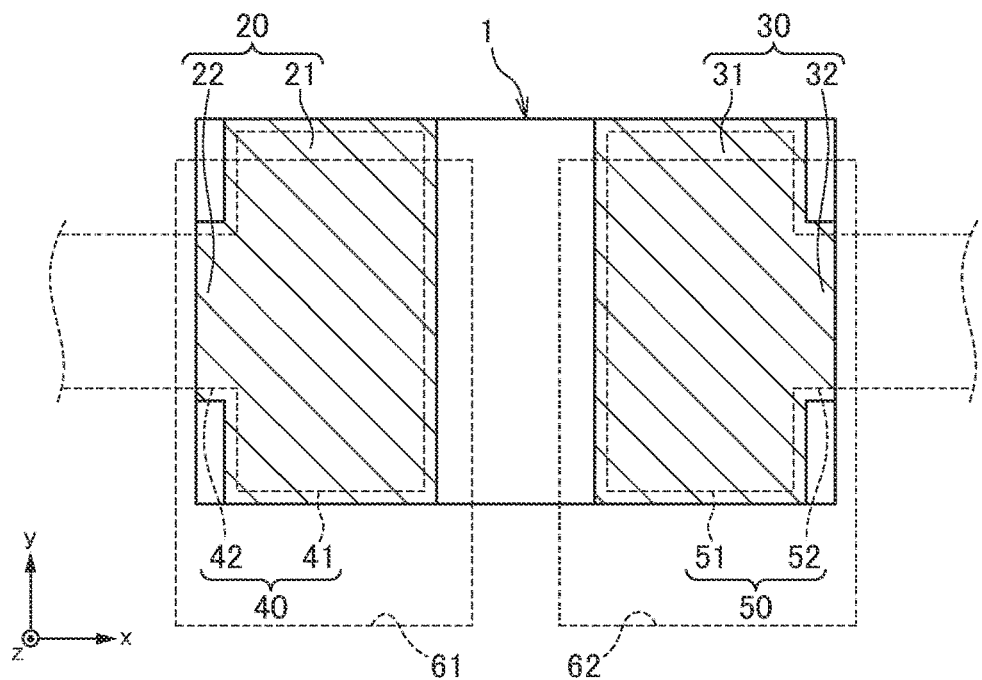
FIG. 7 is a schematic view for explaining a state where the openings 61 and 62 of the solder resist 60 are deviated.

The protruding parts 22, 32 and sub patterns 42, 52 play a role of positioning the surface-mount electronic component 1 in the y-direction. That is, the solder 70 does not adhere to the clearance area C, so that the surface-mount electronic component 1 is subjected to centering in the y-direction by surface tension of the solder 70 positioned between the protruding parts 22, 32 and the sub patterns 42, 52. Thus, as illustrated in FIG. 7, even when the openings 61 and 62 of the solder resist 60 are deviated in the y-direction to partly cover the main patterns 41 and 51 with the solder resist 60, it is possible to properly position the surface-mount electronic component 1 with respect to the land patterns 40 and 50 by the centering effect brought about by the protruding parts 22, 32 and the sub patterns 42, 52. The disadvantage that the main patterns 41 and 51 are partly covered with the solder resist 60 due to misalignment is more likely to occur when the difference between the width of each of the openings 61, 62 in the y-direction and the width of each of the main patterns 41, 51 in the y-direction is small. Such a case occurs more easily as the width of each of the terminal electrodes 20 and 30 in the y-direction of the surface-mount electronic component 1 to be mounted on the substrate 3 is larger, in particular, when the terminal electrodes 20 and 30 are each provided over the entire width of the mounting surface 11 in the y-direction.

To make the centering effect sufficiently large, the length of each of the protruding parts 22 and 32 in the x-direction, i.e., the width of the clearance area C in the x-direction needs to be ensured to some extent. Specifically, when the length of each of the protruding parts 22 and 32 in the x-direction is set to 30 μm or more, it is possible to sufficiently enhance the centering effect, and when the length of each of the protruding parts 22 and 32 in the x-direction is set to about 50 μm, it is possible to further enhance the centering effect. There is no upper limit on the length of each of the protruding parts 22 and 32 in the x-direction; however, when the length of each of the protruding parts 22 and 32 in the x-direction is excessively large, the total area of the main areas 21 and 31 decreases, with the result that the bonding strength of the solder 70 may lower. From the above reason, the length of each of the protruding parts 22 and 32 in the x-direction may be set to 100 μm or less.

As descried above, in the surface-mount electronic component 1 according to the present embodiment, the terminal electrodes 20 and 30 each have a convex shape, so that even when misalignment occurs in the solder resist 60 of the substrate 3, the surface-mount electronic component 1 can be subjected to centering properly in the y-direction without being deviated from the land patterns 40 and 50. Such effect can be obtained even in electronic components other than those of a two-terminal type; however, in electronic components of three-or-more terminal type, e.g., electronic components of four-terminal type, deviation is less likely to occur in the mounting position due to surface tension of the solder obtained in each terminal electrode. On the other hand, in two-terminal electronic components like the surface-mount electronic component 1 according to the present embodiment, deviation in the mounting position is more likely to occur due to misalignment of the solder resist 60. However, the surface-mount electronic component 1 according to the present embodiment can prevent such deviation in the mounting position.

Figure 8:
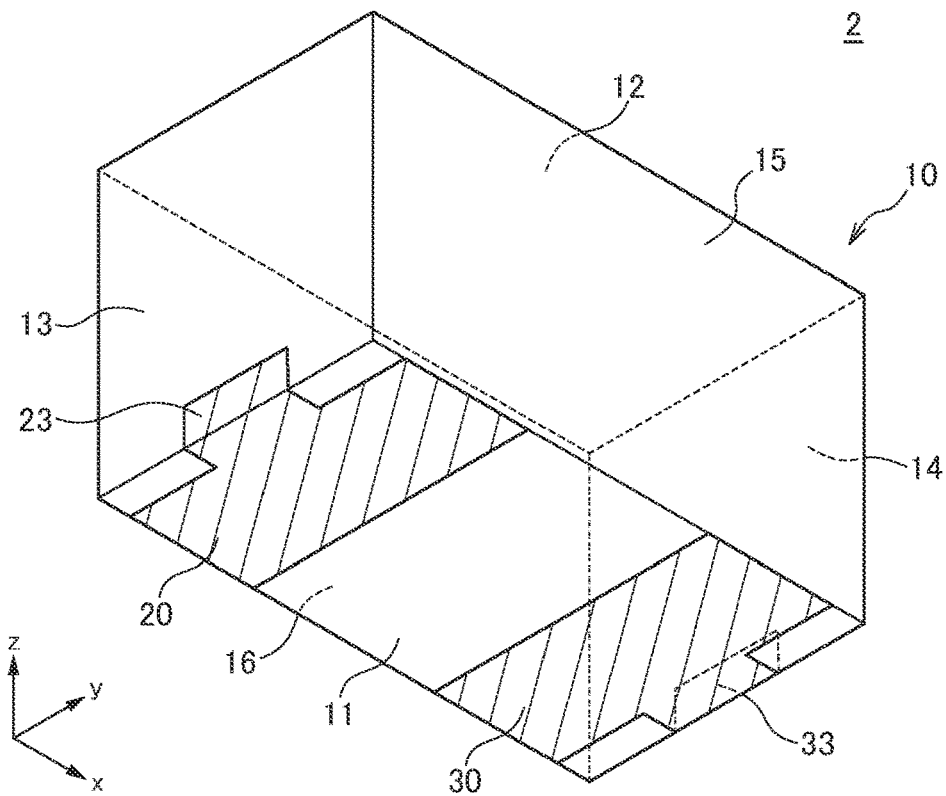
FIG. 8 is a schematic perspective view illustrating the outer appearance of a surface-mount electronic component 2 according to a second embodiment of the present disclosure.

FIG. 8 is a schematic perspective view illustrating the outer appearance of a surface-mount electronic component 2 according to a second embodiment of the present disclosure.

The surface-mount electronic component 2 illustrated in FIG. 8 differs from the surface-mount electronic component 1 according to the first embodiment in that side surface parts 23 and 33 of the terminal electrodes 20 and 30 are provided respectively on the side surfaces 13 and 14 of the main body part 10. Other configurations are the same as those of the surface-mount electronic component 1 according to the first embodiment, so the same reference numerals are given to the same elements, and overlapping description will be omitted.

The side surface parts 23 and 33 of the terminal electrodes 20 and 30 are connected respectively to the protruding parts 22 and 32, and the positions thereof in the y-direction coincide respectively with the protruding parts 22 and 32. The height of each of the side surface parts 23 and 33 in the z-direction may be sufficiently smaller than the height of the main body part 10 in the z-direction, specifically, half or less of the height of the main body part 10 in the z-direction, and may be equivalent to the width of each of the protruding parts 22 and 32 in the x-direction.

Figure 9:
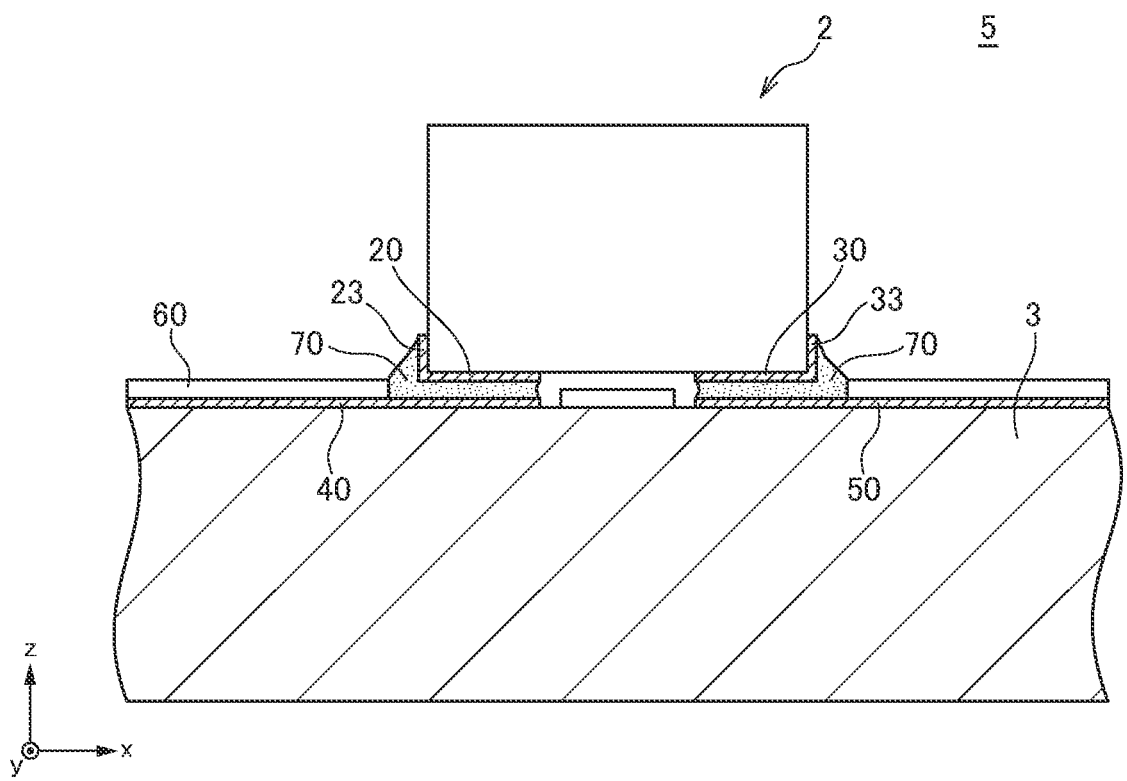
FIG. 9 is a front view of a circuit board 5 including the substrate 3 and the surface-mount electronic component 2 mounted on the substrate 3.

FIG. 9 is a front view of a circuit board 5 including the substrate 3 and the surface-mount electronic component 2 mounted on the substrate 3.

As illustrated in FIG. 9, when the surface-mount electronic component 2 is mounted on the substrate 3, a fillet of the solder 70 is formed on the side surface parts 23 and 33 of the terminal electrodes 20 and 30. The spread of the fillet is restricted by the boundary between the sub patterns 42, 52 and the solder resist 60, i.e., the edges of the openings 61 and 62, so that the mounting position of the surface-mount electronic component 2 in the x-direction is also subject to centering. In addition, a space between the surface-mount electronic component 2 and another electronic component mounted adjacent thereto becomes necessarily wider in the x-direction in which wirings extend on the substrate 3 than in the y-direction in which no wiring exists, so that high-density mounting is not hindered by the fillet of the solder 70.

While the one embodiment of the present disclosure has been described, the present disclosure is not limited to the above embodiment, and various modifications may be made within the scope of the present disclosure, and all such modifications are included in the present disclosure.

The technology according to the present disclosure includes the following configuration examples but not limited thereto.

A surface-mount electronic component according to the present disclosure includes: a main body part having a mounting surface; a first terminal electrode provided on one end side of the mounting surface in the long side direction thereof; and a second terminal electrode provided on the other end side of the mounting surface in the long side direction thereof. The first and second terminal electrodes each include a main area extending in the short side direction of the mounting surface and a protruding part provided at the center portion in the short side direction so as to protrude from the main area to the end portion of the mounting surface in the long side direction.

According to the present disclosure, the protruding part of each of the first and second terminal electrodes play a roll of positioning the electronic component in the short side direction upon mounting, thereby suppressing deviation in the mounting position of the electronic component in the short side direction.

In the present disclosure, the length of the protruding part may be 30 μm or more and whereby a clearance area having a length of 30 μm or more where the first and second terminal electrodes do not exist may be formed. With this configuration, it is possible to obtain a sufficient positioning effect in the short side direction.

In the present disclosure, the main area may be provided over the entire width of the mounting surface in the short side direction. Although the mounting position is more likely to be deviated when the main area is provided over the entire width of the mounting surface in the short side direction, the deviation of the mounting position can be suppressed even in this case.

In the present disclosure, the main body part may further include side surfaces positioned in the long side direction and perpendicular to the mounting surface, and the first and second terminal electrodes may not be formed on their corresponding side surfaces. This facilitates formation of the first and second terminal electrodes. Alternatively, the first and second terminal electrodes may each further include a side surface part provided on the side surface of the main body part so as to be connected to the protruding part, and the height of the side surface part in a direction perpendicular to the mounting surface may be smaller than the height of the main body part. This suppresses deviation in the mounting position also in the long side direction of the electronic component.

A circuit board according to the present disclosure incudes: a substrate having first and second land patterns; the above-described surface-mount electronic component mounted on the substrate; and a solder connecting the first and second land patterns to the first and second terminal electrodes, respectively. The first and second land patterns each include a main pattern overlapping the main area and a sub pattern overlapping the protruding part and smaller in width in the short side direction than the main pattern.

According to the present disclosure, the protruding part of the terminal electrode is positioned by the sub pattern on the substrate side, thereby making it possible to suppress deviation in the mounting position in the short side direction of the electronic component.

In the present disclosure, the width of the main pattern in the short side direction may be smaller than the width of the main area in the short side direction. This suppresses exposure of the solder in the short side direction, enabling high-density mounting.

As described above, according to the present disclosure, it is possible to suppress, in a surface-mount two-terminal electronic component and a circuit board having the same, deviation in mounting position of the electronic component in the short side direction thereof.

What is claimed is:

1. A surface-mount electronic component comprising:
   a main body part having a mounting surface, the mounting surface having first and second edge extending in a short side direction of the mounting surface and arranged in a long side direction of the mounting surface;
   a first terminal electrode provided on a first edge side of the mounting surface; and
   a second terminal electrode provided on a second edge side of the mounting surface,
   wherein the first terminal electrode includes a first main area extending in the short side direction and a first protruding part provided at a center portion in the short side direction so as to protrude from the first main area of the first edge in the long side direction, and
   wherein the second terminal electrode includes a second main area extending in the short side direction and a second protruding part provided at a center portion in the short side direction so as to protrude from the second main area to the second edge in the long side direction.

2. The surface-mount electronic component as claimed in claim 1, wherein a length of each of the first protruding part and the second protruding part is 30 μm or more and whereby a clearance area having a length of 30 μm or more where the first and second terminal electrodes do not exist is formed.

3. The surface-mount electronic component as claimed in claim 1, wherein each of the first main area and the second main area is provided over an entire width of the mounting surface in the short side direction.

4. The surface-mount electronic component as claimed in claim 1,
wherein the main body part further includes first and second side surfaces positioned in the long side direction and perpendicular to the mounting surface,
wherein the first edge if boundary between the mounting surface and the first side surface,
wherein the second edge is a boundary between the mounting surface and the second side surface,
wherein the first terminal electrode is not formed on the first side surface, and
wherein the second terminal electrode is not formed on the second side surface.

5. The surface-mount electronic component as claimed in claim 1,
wherein the main body part further includes first and second side surfaces positioned in the long side direction and perpendicular to the mounting surface,
wherein the first edge is a boundary between the mounting surface and the first side surface,
wherein the second edge is a boundary between the mounting surface and the second side surface,
wherein the first terminal electrode further includes a first side surface part provided on the first side surface of the main body part so as to be connected to the first protruding part, and
wherein the second terminal electrode further includes a second side surface part provided on the second side surface of the main body part so as to be connected to the second protruding part.

6. A circuit board comprising:
a substrate having first and second land patterns;
a surface-mount electronic component comprising:
    a main body part having a mounting surface;
    a first terminal electrode provided on one end side of the mounting surface in a long side direction thereof; and
    a second terminal electrode provided on other end side of the mounting surface; and
a solder connecting the first and second land patterns to the first and second terminal electrodes, respectively,
wherein each of the first and second terminal electrode includes a main area extending in a short side direction of the mounting surface and a protruding part provided at a center portion in the short side direction so as to protrude from the main area to an end portion of the mounting surface in the long side direction, and
wherein each of the first and second land patterns includes a main pattern overlapping the main area and a sub pattern overlapping the protruding part and smaller in width in the short side direction than the main pattern.

7. The circuit board as claimed in claim 6, wherein a width of the main pattern in the short side direction is smaller than a width of the main area in the short side direction.

8. A surface-mount electronic component comprising:
a main body part having a mounting surface;
a first terminal electrode provided on one end side of the mounting surface in a long side direction thereof; and
a second terminal electrode provided on other end side of the mounting surface,
wherein each of the first and second terminal electrode includes a main area extending in a short side direction of the mounting surface and a protruding part provided at a center portion in the short side direction so as to protrude from the main area to an end portion of the mounting surface in the long side direction,
wherein the main body part further includes side surfaces positioned in the long side direction and perpendicular to the mounting surface, and
wherein the first and second terminal electrodes are not formed on their corresponding side surfaces.

9. The surface-mount electronic component as claimed in claim 8, wherein a length of the protruding part is 30 m or more and whereby a clearance area having a length of 30 μm or more where the first and second terminal electrodes do not exist is formed.

10. The surface-mount electronic component as claimed in claim 8, wherein the main area is provided over an entire width of the mounting surface in the short side direction.

11. A surface-mount electronic component comprising:
a main body part having a mounting surface;
a first terminal electrode provided on one end side of the mounting surface in a long side direction thereof; and
a second terminal electrode provided on other end side of the mounting surface in the long side direction thereof,
wherein each of the first and second terminal electrode includes a main area extending in a short side direction of the mounting surface and a protruding part provided at a center portion in the short side direction so as to protrude from the main area to an end portion of the mounting surface in the long side direction,
wherein the main body part further includes side surfaces positioned in the long side direction and perpendicular to the mounting surface,
wherein each of the first and second terminal electrodes further includes a side surface part provided on the side surface of the main body part so as to be connected to the protruding part, and
wherein a height of the side surface part in a direction perpendicular to the mounting surface is smaller than a height of the main body part.

12. The surface-mount electronic component as claimed in claim 11, wherein a length of the protruding part is 30 μm or more and whereby a clearance area having a length of 30 μm or more where the first and second terminal electrodes do not exist is formed.

13. The surface-mount electronic component as claimed in claim 11, wherein the main area is provided over an entire width of the mounting surface in the short side direction.

* * * * *